(12) United States Patent
Kawase et al.

(10) Patent No.: US 10,504,820 B2
(45) Date of Patent: Dec. 10, 2019

(54) SEMICONDUCTOR MODULE AND ELECTRIC POWER CONVERSION DEVICE

(71) Applicant: Mitsubishi Electric Corporation, Tokyo (JP)

(72) Inventors: Tatsuya Kawase, Tokyo (JP); Yosuke Nakata, Tokyo (JP); Yuji Imoto, Tokyo (JP); Osamu Usui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/316,419

(22) PCT Filed: Oct. 21, 2016

(86) PCT No.: PCT/JP2016/081329
§ 371 (c)(1),
(2) Date: Jan. 9, 2019

(87) PCT Pub. No.: WO2018/073965
PCT Pub. Date: Apr. 26, 2018

(65) Prior Publication Data
US 2019/0295924 A1    Sep. 26, 2019

(51) Int. Cl.
*H01L 23/467*    (2006.01)
*H01L 23/473*    (2006.01)
(Continued)

(52) U.S. Cl.
CPC ............ *H01L 23/473* (2013.01); *H01L 25/18* (2013.01); *H02M 7/003* (2013.01); *H02M 7/5387* (2013.01)

(58) Field of Classification Search
CPC ....... H01L 23/34; H01L 23/36; H01L 23/367; H01L 23/3672; H01L 23/3675; H01L 23/46; H01L 23/467
See application file for complete search history.

(56) References Cited

U.S. PATENT DOCUMENTS 6,330,153 B1 *  12/2001  Ketonen ............ H05K 7/20145
                                                    165/104.33
7,706,141 B2 *  4/2010   Besold ................ H05K 7/1461
                                                    361/690
(Continued)

FOREIGN PATENT DOCUMENTS

JP    S64-071156 A    3/1989
JP    2014-082311 A   5/2014
JP    2016-006826 A   1/2016

OTHER PUBLICATIONS

International Search Report; Written Opinion; and Notification of Transmittal of the International Search Report and the Written Opinion of the International Searching Authority, or the Declaration issued in PCT/JP2016/081329; dated Jan. 17, 2017.

*Primary Examiner* — Gary L Laxton
(74) *Attorney, Agent, or Firm* — Studebaker & Brackett PC

(57) ABSTRACT

A plurality of semiconductor devices (4*a*-4*f*, 5*a*-5*f*) are provided on an upper surface of the conductive base plate (1) via an insulating substrate (2) and a conductive pattern (3*a*-3*d*). A plurality of fins (6) are provided on a lower surface of the conductive base plate (1). A heat dissipating base plate (7) is provided to tips of the plurality of fins (6). A cooler (8) having an inflow port (9*a*) and an outflow port (9*b*) in a bottom surface surrounds the plurality of fins (6) and the heat dissipating base plate (7). A partition (10) separates a space surrounded by the cooler (8) and the heat dissipating base plate (7) into an inflow-side space (11*a*) connected to the inflow port (9*a*) and an outflow-side space (11*b*) connected to the outflow port (9*b*). A first slit (12*a*) is provided in a central portion of the heat dissipating base plate (7). Second and third slits (12*b*, 12*c*) are respectively provided on both sides of the heat dissipating base plate (7) along a direction from an inflow side to an outflow side. One (Continued)

of the first slit (12*a*) and the second and third slits (12*b*,12*c*) is an inflow-side slit connected to the inflow-side space (11*a*) and the other is an outflow-side slit connected to the outflow-side space (11*b*).

10 Claims, 12 Drawing Sheets

(51) Int. Cl.
    *H02M 7/5387*     (2007.01)
    *H02M 7/00*     (2006.01)
    *H01L 25/18*     (2006.01)

(56) References Cited

U.S. PATENT DOCUMENTS

| 2013/0135823 A1* | 5/2013 | Kim | H01L 23/043 |
| | | | 361/697 |
| 2014/0376185 A1* | 12/2014 | Lee | H01L 23/467 |
| | | | 361/694 |

* cited by examiner

SEMICONDUCTOR MODULE AND ELECTRIC POWER CONVERSION DEVICE

FIELD

The present invention relates to a cooler-integrated semiconductor module and an electric power conversion device.

BACKGROUND

Semiconductor modules are used for vehicular motor control and the like, and there is a continuing demand for size and weight reduction of such modules. In order to realize size reduction, a structure for efficiently cooling semiconductor devices is indispensable. Therefore, development of a direct cooling structure, in which semiconductor devices are directly joined onto cooling fins and directly cooled, has been advanced.

A semiconductor module in which semiconductor devices are directly cooled with fins has been suggested (see, for example, PTL 1). However, since there are a total of three connection ports, namely, two inflow ports and one outflow port, the mounting process can be complicated. Further, cooling of the fins advances in a path connecting the inflow port and the outflow port, but it is difficult for cooling water to flow to the outside of the path, and the cooling performance is lowered. As a result, more uniform cooling performance cannot be obtained.

A cooler-integrated semiconductor module has also been suggested (see, for example, PTL 2). However, since cooling water collides, without being divided, with fins, a long flow path in one direction is realized, and a large difference occurs in the cooling performance between a device on the upstream side and a device on the downstream side.

In addition, a cooler-integrated module in which cooling water is divided has also been suggested (see, for example, PTL 3). However, the jets of cooling water collide directly against the fins, dynamic pressure is generated, and the fins are subjected to large stress. For this reason, high strength is required for the fins. Increase in pressure loss due to dynamic pressure generation is also a concern. Furthermore, since water flow is greatly disturbed in the flow path when water is jetted from a plurality of jet openings, the process is difficult to control and eventually a large difference in cooling performance occurs between the inflow side and the outflow side.

CITATION LIST

Patent Literature

[PTL 1] Japanese Patent Application Publication No. 2016-6826
[PTL 2] Japanese Patent Application Publication No. S64-71156
[PTL 3] Japanese Patent Application Publication No. 2014-82311

SUMMARY

Technical Problem

In the conventional cooler-integrated module, the division of flow at the time of flowing to and from the fins is insufficient and it is impossible to cool uniformly a plurality of semiconductor devices. For this reason, there is a difference in cooling performance between the upstream side and the downstream side, and thermal design of the module is limited by the temperature of the semiconductor device disposed downstream. Also, since it is difficult to control the water flow and the pressure loss also increases, the allowable heat generation per unit volume of the module is small. In addition, the structure is complicated, it is difficult to arrange the inflow port and the outflow port on the bottom surface, and it is difficult to reduce the floor area.

The present invention has been made to solve the problems as described above, and an object of the present invention is to provide a semiconductor module and an electric power conversion device which have a simple structure and make it possible to cool uniformly a plurality of semiconductor devices, improve the allowable heat generation per unit volume of the module, and reduce the floor area.

Solution to Problem

A semiconductor module according to the present invention includes: a conductive base plate; an insulating substrate provided on an upper surface of the conductive base plate; a conductive pattern provided on the insulating substrate; a plurality of semiconductor devices provided on the conductive pattern; a plurality of fins provided on a lower surface of the conductive base plate; a heat dissipating base plate provided to tips of the plurality of fins; a cooler provided so as to surround the plurality of fins and the heat dissipating base plate and having an inflow port and an outflow port provided in a bottom surface of the cooler; and a partition separating a space surrounded by the cooler and the heat dissipating base plate into an inflow-side space connected to the inflow port and an outflow-side space connected to the outflow port, wherein a first slit is provided in a central portion of the heat dissipating base plate, second and third slits are respectively provided on both sides of the heat dissipating base plate along a direction from an inflow side to an outflow side, and one of the first slit and the second and third slits is an inflow-side slit connected to the inflow-side space and the other is an outflow-side slit connected to the outflow-side space.

Advantageous Effects of Invention

In the present invention, the inflow or outflow of the cooling water to the plurality of fins is divided by the first slit and the second and third slits. Therefore, it is possible to cool uniformly the plurality of semiconductor devices as compared with unidirectional cooling. Furthermore, the allowable heat generation per unit volume of the module can be increased. In addition, a simple structure has only one inflow port and one outflow port, and the connection with a pump is facilitated. Further, the inflow port and the outflow port can be arranged on the bottom surface of the cooler, and the floor area can be reduced.

DESCRIPTION OF EMBODIMENTS

A semiconductor module and an electric power conversion device according to the embodiments of the present invention will be described with reference to the drawings. The same components will be denoted by the same symbols, and the repeated description thereof may be omitted.

Embodiment 1

Figure 1:
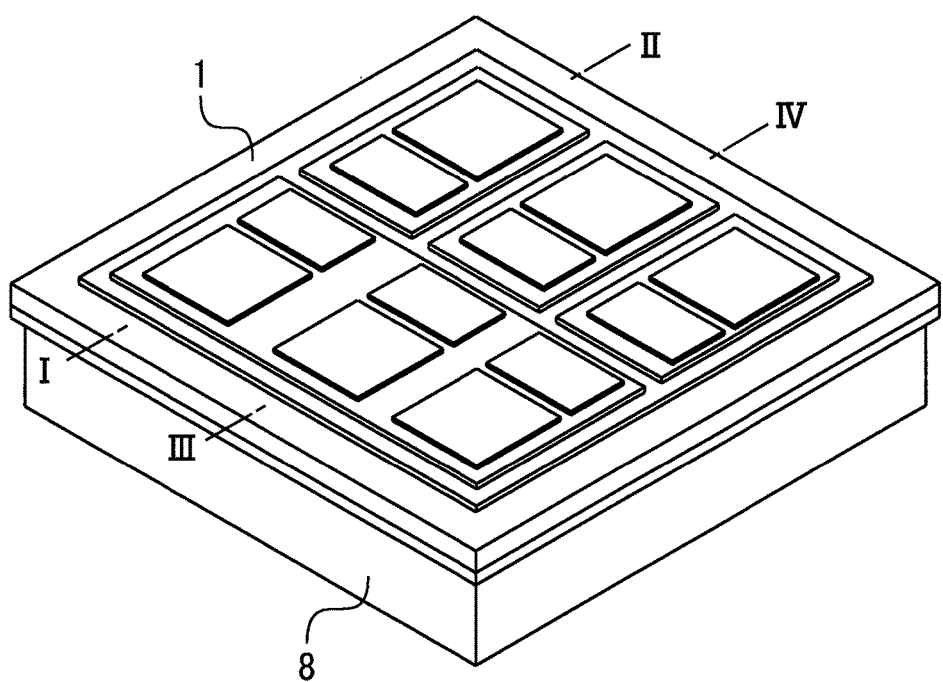
FIG. 1 is a perspective view showing a semiconductor module according to Embodiment 1 of the present invention.
Figure 2:
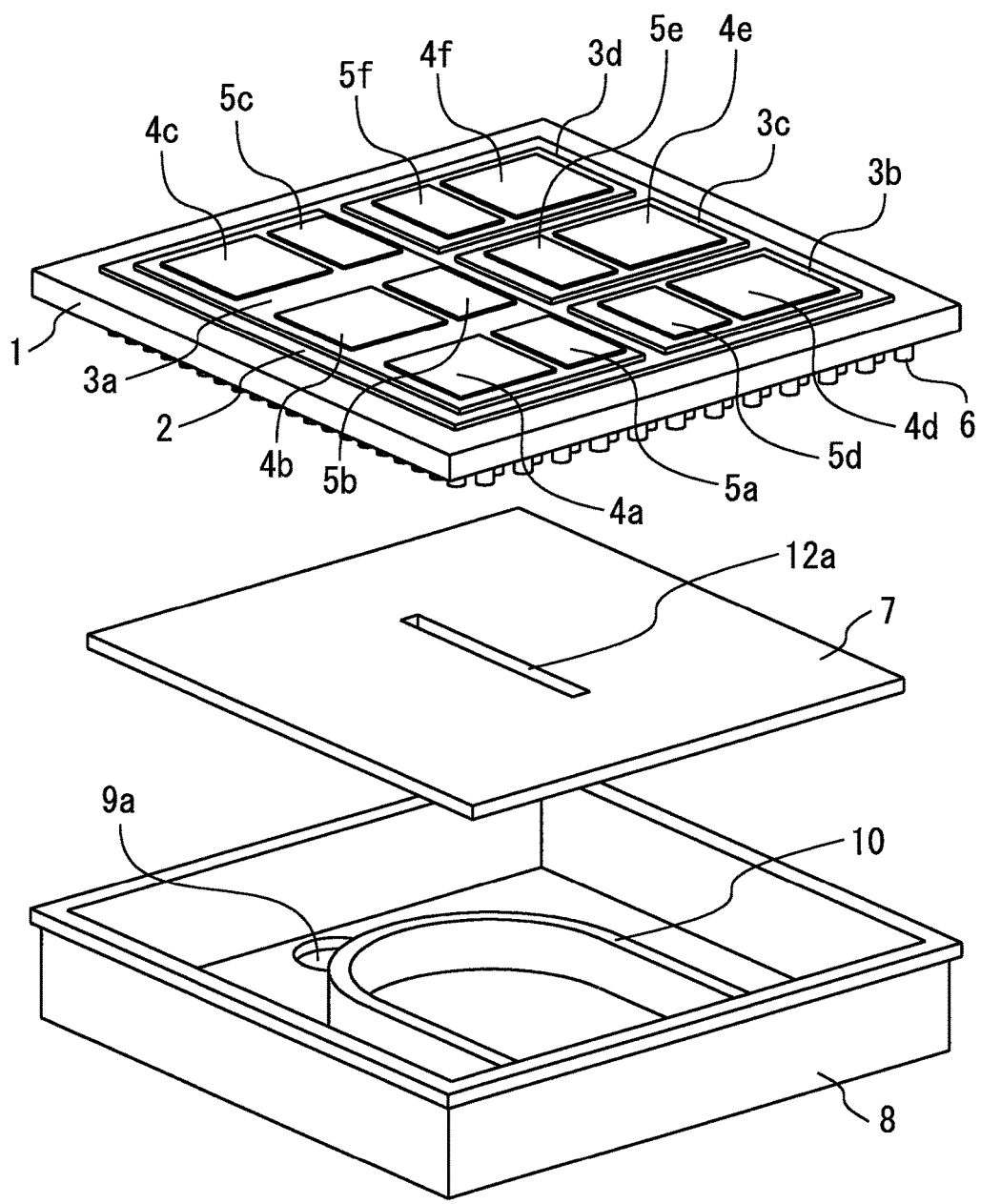
FIG. 2 is a perspective view showing a disassembled state of the semiconductor module according to Embodiment 1 of the present invention.
Figure 3:
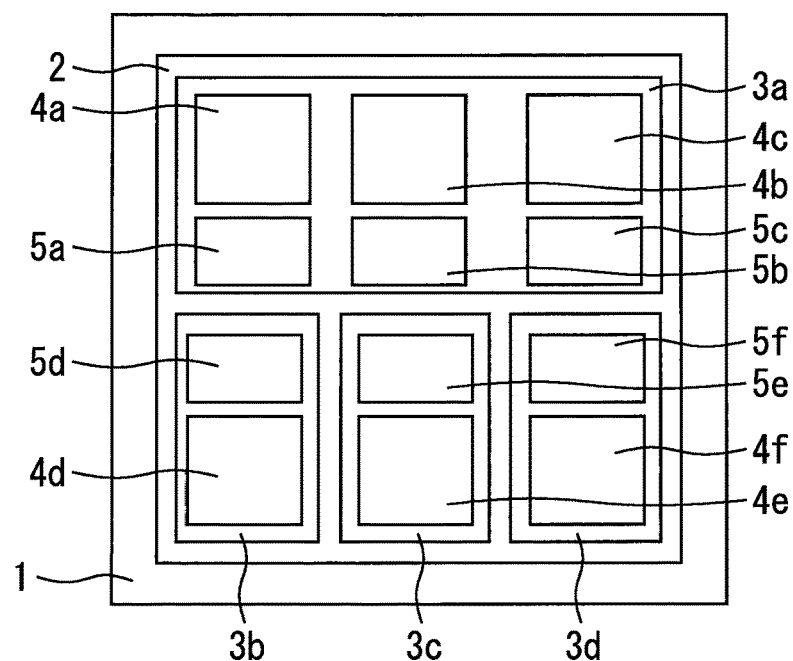
FIG. 3 is a top view of the conductive base plate of the semiconductor module according to Embodiment 1 of the present invention.
Figure 4:
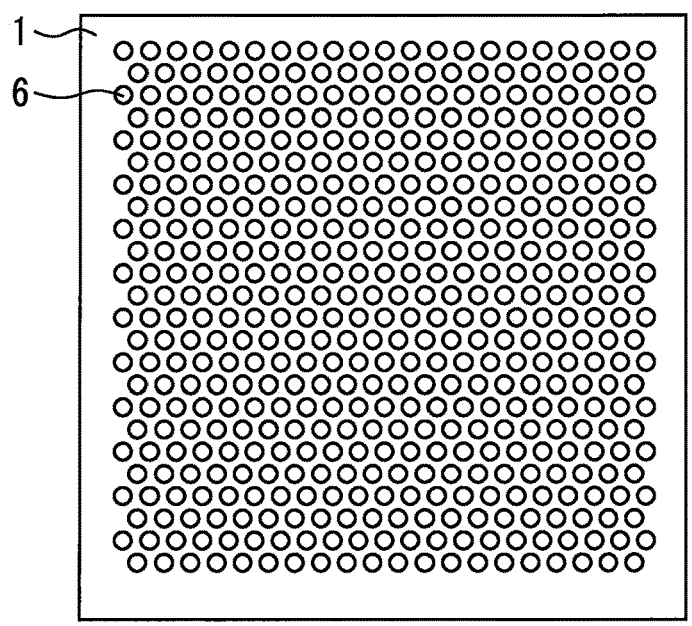
FIG. 4 is a bottom view of the conductive base plate of the semiconductor module according to Embodiment 1 of the present invention.
Figure 5:
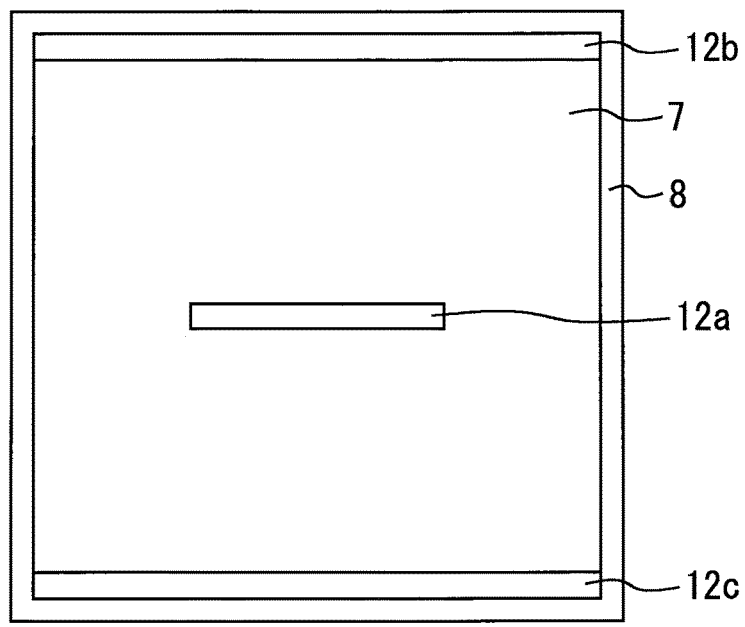
FIG. 5 is a top view of the heat dissipating base plate of the semiconductor module according to Embodiment 1 of the present invention.
Figure 6:
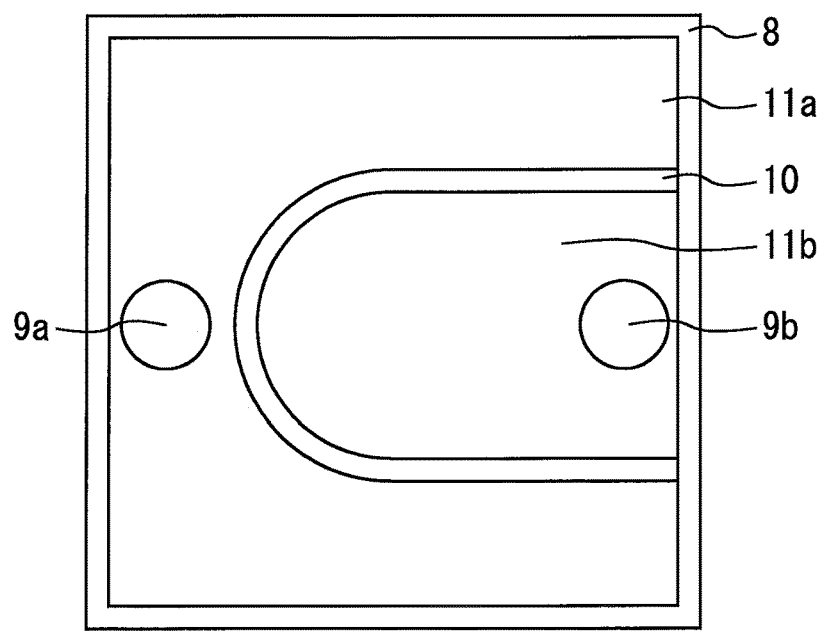
FIG. 6 is a top view of the cooler of the semiconductor module according to Embodiment 1 of the present invention.
Figure 7:
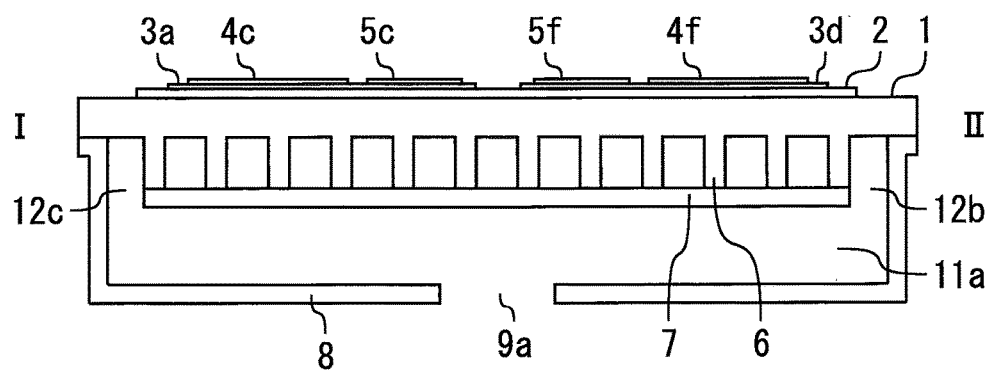
FIG. 7 is a cross-sectional view taken along line I-II of FIG. 1.
Figure 8:
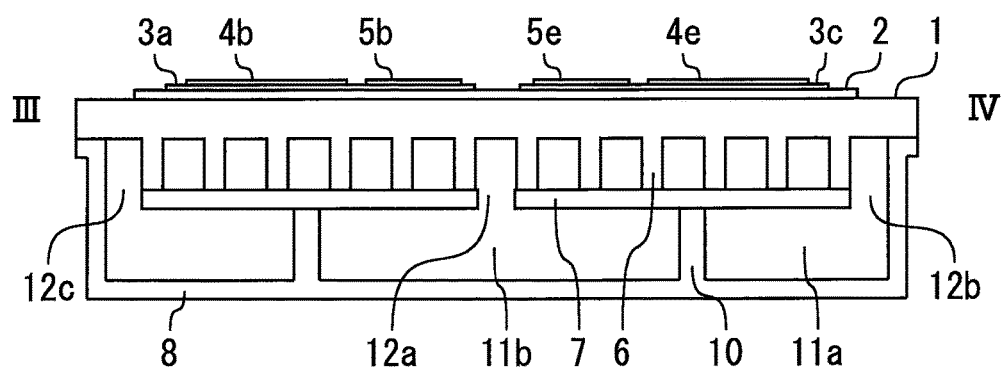
FIG. 8 is a cross-sectional view taken along line III-IV of FIG. 1.

FIG. 1 is a perspective view showing a semiconductor module according to Embodiment 1 of the present invention. FIG. 2 is a perspective view showing a disassembled state of the semiconductor module according to Embodiment 1 of the present invention. FIG. 3 is a top view of the conductive base plate of the semiconductor module according to Embodiment 1 of the present invention. FIG. 4 is a bottom view of the conductive base plate of the semiconductor module according to Embodiment 1 of the present invention. FIG. 5 is a top view of the heat dissipating base plate of the semiconductor module according to Embodiment 1 of the present invention. FIG. 6 is a top view of the cooler of the semiconductor module according to Embodiment 1 of the present invention. FIG. 7 is a cross-sectional view taken along line I-II of FIG. 1. FIG. 8 is a cross-sectional view taken along line III-IV of FIG. 1. This semiconductor module is a cooler-integrated module.

The conductive base plate 1 is made of Al or Cu and has a size of about 80 mm×80 mm and a thickness of about 2 mm to 4 mm. An insulating substrate 2 having a conductive pattern made of Al or Cu adhered on both sides is joined to the upper surface of the conductive base plate 1 by a joining material such as a solder or braze. The insulating substrate 2 is made of AlN or $Si_3N_4$ and has a thickness of about 0.32 mm to 1 mm. In order to reduce the thermal resistance, it is desirable to minimize the thickness of the insulating substrate 2.

Conductive patterns 3a to 3d are provided on the upper surface of the insulating substrate 2, and semiconductor devices 4a to 4f, 5a to 5f are joined to the upper surface thereof by a joining material. Here, the semiconductor devices 4a to 4c, 5a to 5c are provided on the conductive pattern 3a, the semiconductor devices 4d and 5d are provided on the conductive pattern 3b, the semiconductor devices 4e and 5e are provided on the conductive pattern 3c, and the semiconductor devices 4f and 5f are provided on the conductive pattern 3d. For example, the semiconductor devices 4a to 4f are switching devices such as IGBTs or power MOSFETs, and the semiconductor devices 5a to 5f are freewheeling diodes. In order to protect the semiconductor devices 4a to 4f, 5a to 5f, it is desirable to cover the upper surface of the conductive base plate 1 with a case or molding resin.

In order to improve the cooling performance, a plurality of fins 6 are provided on the lower surface of the conductive base plate 1. The plurality of fins 6 are pin fins, straight fins or conical fins. A heat dissipating base plate 7 is brazed to the tips of the plurality of fins 6.

A cooler 8 is provided so as to surround the plurality of fins 6 and the heat dissipating base plate 7. An inflow port 9a and an outflow port 9b are provided in the bottom surface of the cooler 8. A partition 10 separates the space surrounded by the cooler 8 and the heat dissipating base plate 7 into an inflow-side space 11a connected to the inflow port 9a and an outflow-side space 11b connected to the outflow port 9b.

A first slit 12a extending in the direction from the inflow side to the outflow side is provided in the central portion of the heat dissipating base plate 7. Second and third slits 12b, 12c are respectively provided on both sides of the heat dissipating base plate 7 along the direction from the inflow side to the outflow side. The second and third slits 12b, 12c are inflow-side slits connected to the inflow-side space 11a, and the first slit 12a is an outflow-side slit connected to the outflow-side space 11b.

Figure 9:
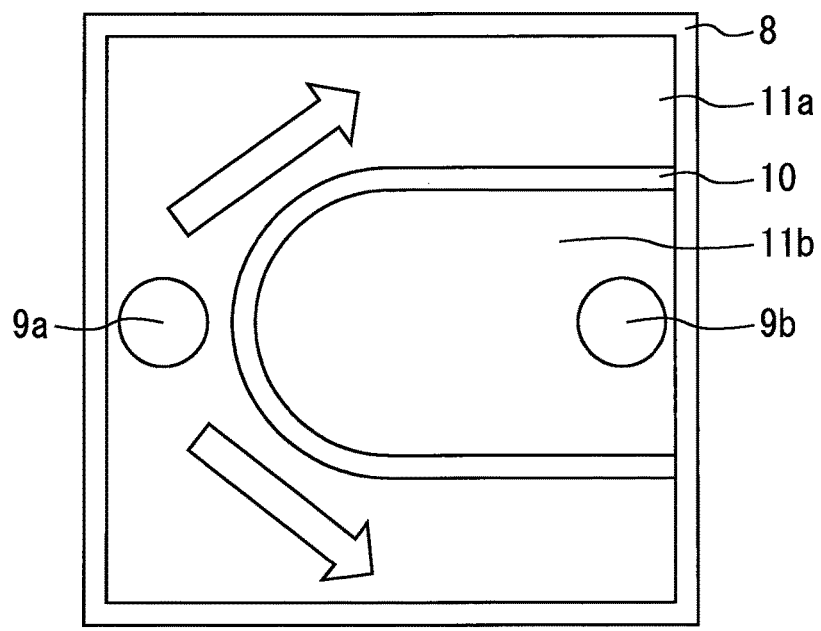
FIG. 9 is a diagram showing the flow of cooling water in the semiconductor module according to Embodiment 1 of the present invention.
Figure 11:
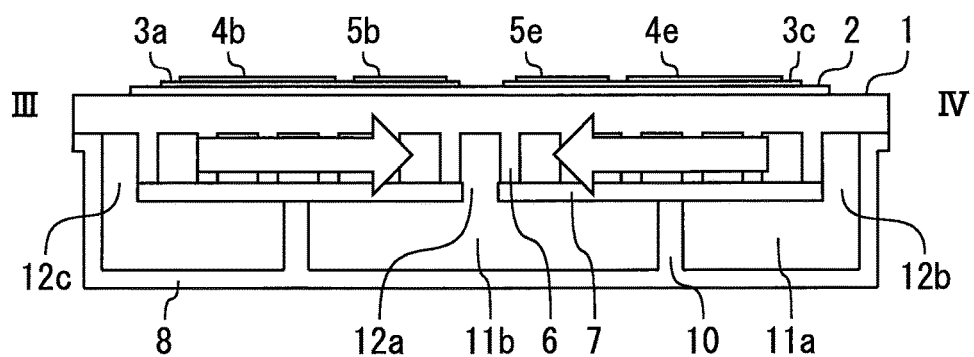
FIG. 11 is a diagram showing the flow of cooling water in the semiconductor module according to Embodiment 1 of the present invention.
Figure 12:
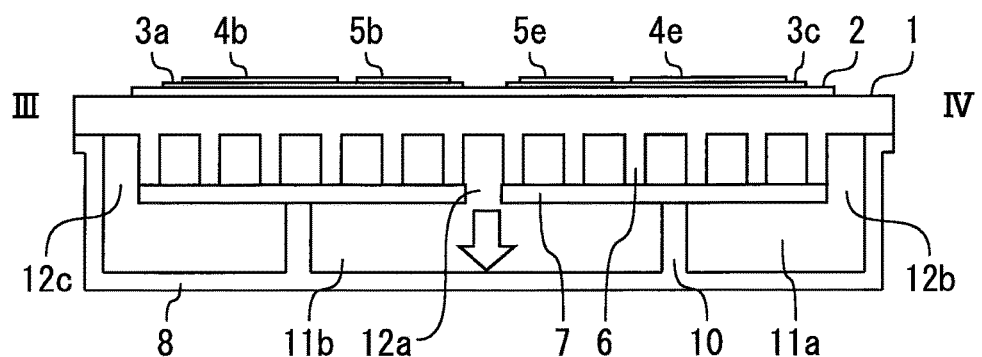
FIG. 12 is a diagram showing the flow of cooling water in the semiconductor module according to Embodiment 1 of the present invention.
Figure 13:
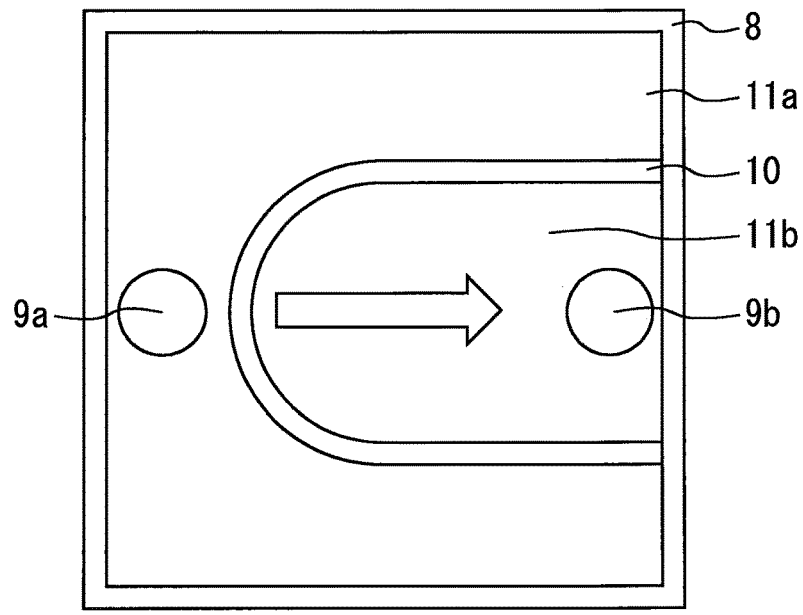
FIG. 13 is a diagram showing the flow of cooling water in the semiconductor module according to Embodiment 1 of the present invention.

FIGS. 9 to 13 are diagrams showing the flow of cooling water in the semiconductor module according to Embodiment 1 of the present invention. FIGS. 9 and 13 correspond to the top view of FIG. 6, FIG. 10 corresponds to the cross-sectional view of FIG. 7, and FIGS. 11 and 12 correspond to the cross-sectional view of FIG. 8. The arrows in the figure show the flow of cooling water.

Figure 10:
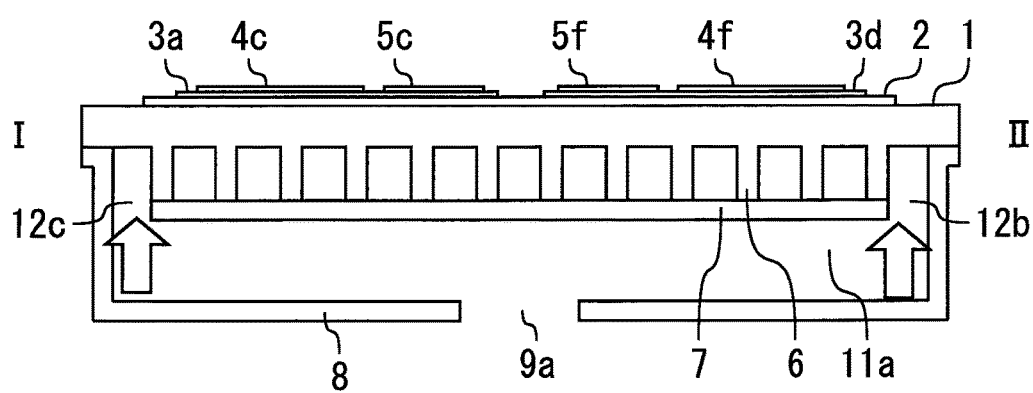
FIG. 10 is a diagram showing the flow of cooling water in the semiconductor module according to Embodiment 1 of the present invention.

First, as shown in FIG. 9, the cooling water flowing from the inflow port 9a fills the inflow-side space 11a. Next, as shown in FIG. 10, the cooling water flows to the upper side of the heat dissipating base plate 7 through the second and third slits 12b, 12c. At this time, the water flows are divided in mutually opposite directions by the two slits. Next, as shown in FIG. 11, the water flows cool the plurality of fins 6 in the order from the outside to the center. Next, as shown in FIG. 12, the cooling water flows into the outflow-side space 11b through the central first slit 12a. Next, as shown in FIG. 13, the cooling water is drained through the outflow port 9b.

As described above, in the present embodiment, the flow of the cooling water to the plurality of fins 6 is divided by the first slit 12a and the second and third slits 12b, 12c. The cooling water flowing from the inflow port 9a is divided by the second and third slits 12b, 12c to cool the plurality of fins 6 from both sides. Therefore, it is possible to cool uniformly the plurality of semiconductor devices 4a to 4f, 5a to 5f as compared with unidirectional cooling. Furthermore, the allowable heat generation per unit volume of the module can be increased. In addition, a simple structure has only one inflow port 9a and one outflow port 9b, and the connection with a pump is facilitated. Further, the inflow port and the outflow port can be arranged on the bottom surface of the cooler 8, and the floor area can be reduced.

In addition, the device on the inflow-side slit into which cooling water flows is preferentially cooled. Therefore, the semiconductor devices 4a to 4f having a larger calorific value than the semiconductor devices 5a to 5f are arranged closer to the inflow-side slit than the semiconductor devices 5a to 5f. That is, the semiconductor devices 4a to 4f are arranged above the second and third slits 12b, 12c on the outer side of the heat dissipating base plate 7. As a result, since the semiconductor devices 4a to 4f having a large calorific value can be preferentially cooled, the entire module can be effectively cooled and the temperature rise can be suppressed.

Figure 14:
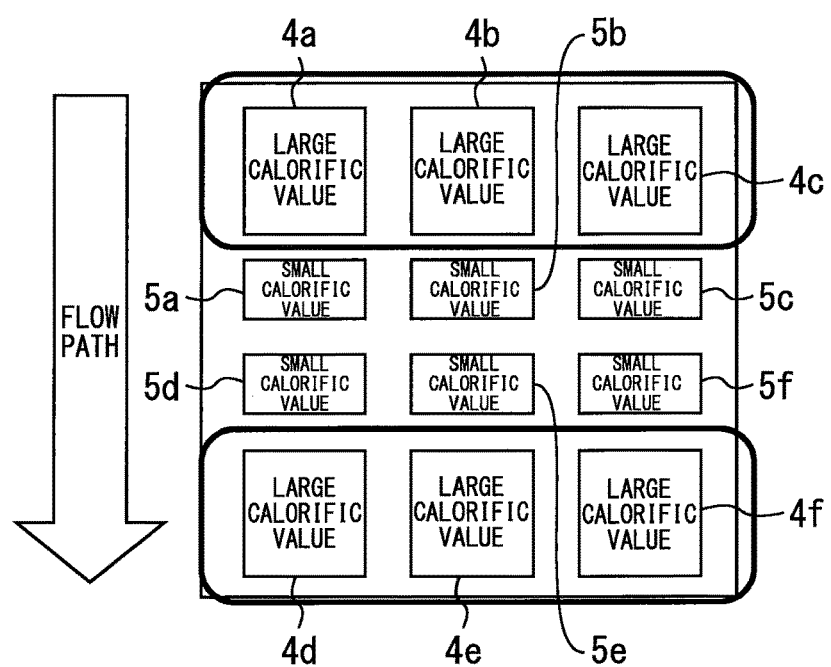
FIG. 14 is a top view for explaining the difference in the flow path of the cooling water.
Figure 15:
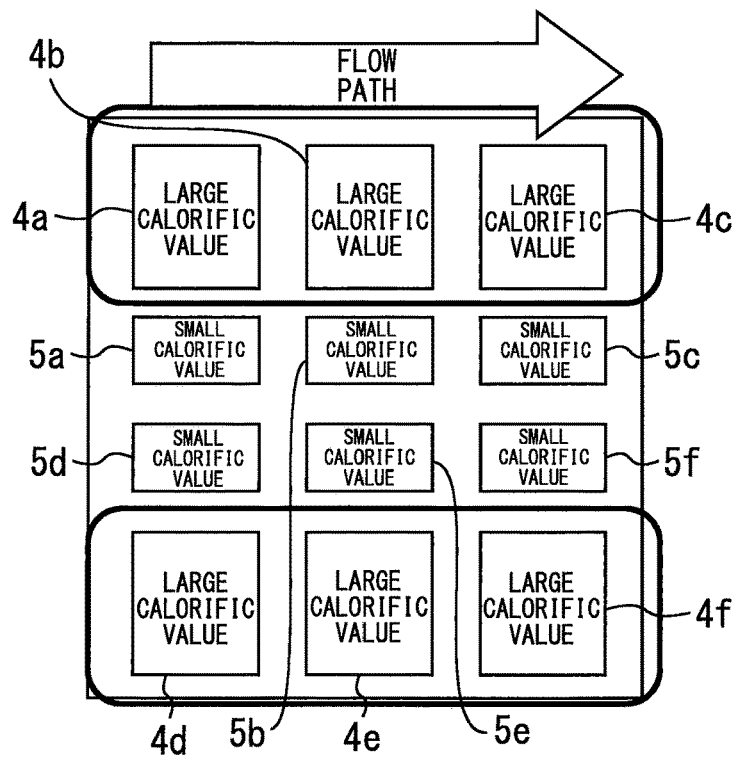
FIG. 15 is a top view for explaining the difference in the flow path of the cooling water.
Figure 16:
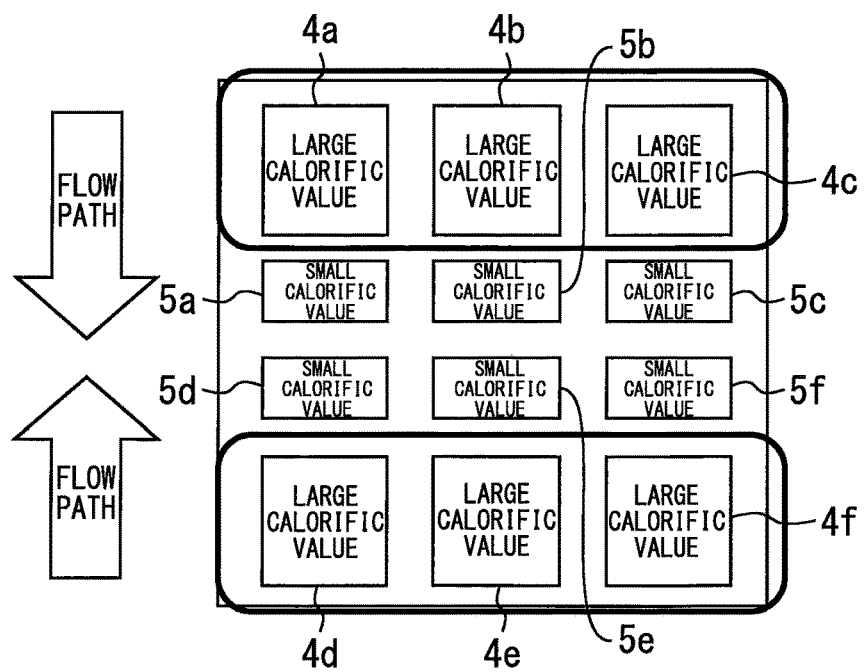
FIG. 16 is a top view for explaining the difference in the flow path of the cooling water.

FIGS. 14 to 16 are top views for explaining the difference in the flow path of the cooling water. When the cooling water is allowed to flow in one direction from one end to the other end as shown in FIG. 14, the group of the semiconductor devices 4a to 4c having a large calorific value is preferentially and uniformly cooled, but the group of semiconductor devices 4d to 4f with a large calorific value is not preferentially cooled. When the cooling water is allowed to flow as shown in FIG. 15, both device groups are cooled neither preferentially nor uniformly. In the present embodiment, as shown in FIG. 16, since the cooling water flows from both ends to the center, both device groups are cooled preferentially and uniformly.

The first slit 12a may be the inflow-side slit, and the second and third slits 12b, 12c may be the outflow-side slits. In this case, the cooling water flowing in from the inflow port 9a of the cooler 8 is introduced to the plurality of fins 6 through one first slit 12a and is discharged from the plurality of fins 6 to the cooler 8 through the second and third slits 12b, 12c. Therefore, by disposing the semiconductor devices 4a to 4f having a large calorific value above the first slit 12a at the center of the heat dissipating base plate 7, the semiconductor devices 4a to 4f can be preferentially cooled.

Embodiment 2

Figure 17:
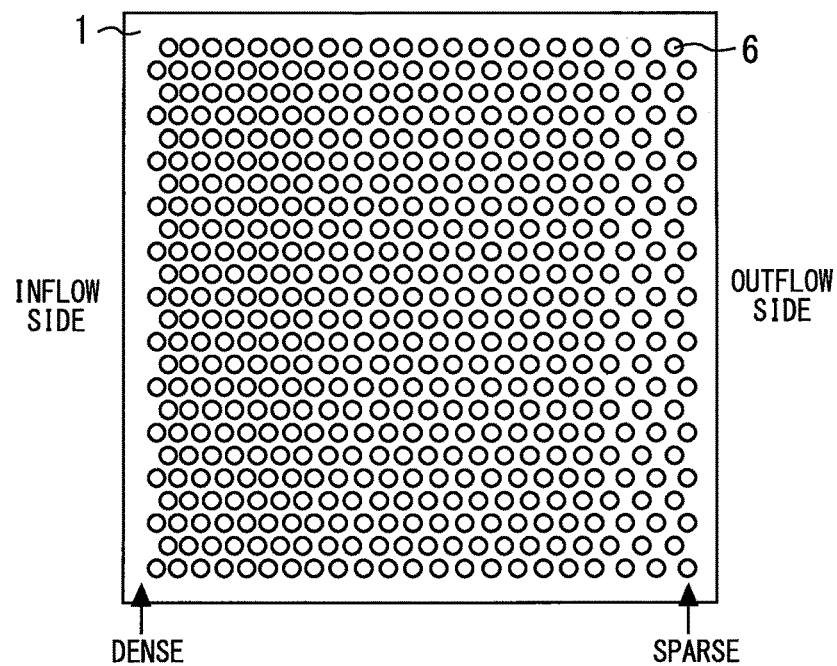
FIG. 17 is a bottom view of the conductive base plate of the semiconductor module according to Embodiment 2 of the present invention.

FIG. 17 is a bottom view of the conductive base plate of the semiconductor module according to Embodiment 2 of the present invention. Out of the plurality of fins 6, the inflow-side fins have a higher fin density than the outflow-side fins. Therefore, this shape makes it more difficult for the cooling water to pass through the fins on the inflow side where the water flow is strong than through the fins on the outflow side where the water flow is weak. As a result, it is possible to prevent the cooling water from concentrating on the inflow-side fins, to increase the inflow to the outflow-side fins, and to ensure uniform amount of cooling water passing through all the fins thereby enabling uniform cooling.

Embodiment 3

Figure 18:
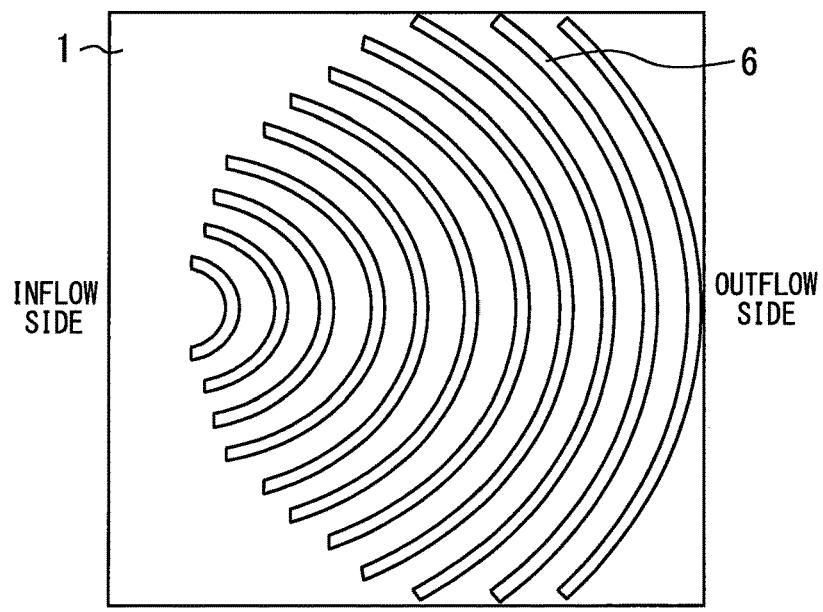
FIG. 18 is a bottom view of the conductive base plate of the semiconductor module according to Embodiment 3 of the present invention.

FIG. 18 is a bottom view of the conductive base plate of the semiconductor module according to Embodiment 3 of the present invention. The shape of the plurality of fins 6 is a radial elliptic arc having a center on the inflow side. In this case, since this shape also makes it more difficult for the cooling water to pass through the inflow-side fins than the outflow-side fins, the same effect as in Embodiment 2 can be obtained.

Embodiment 4

Figure 19:
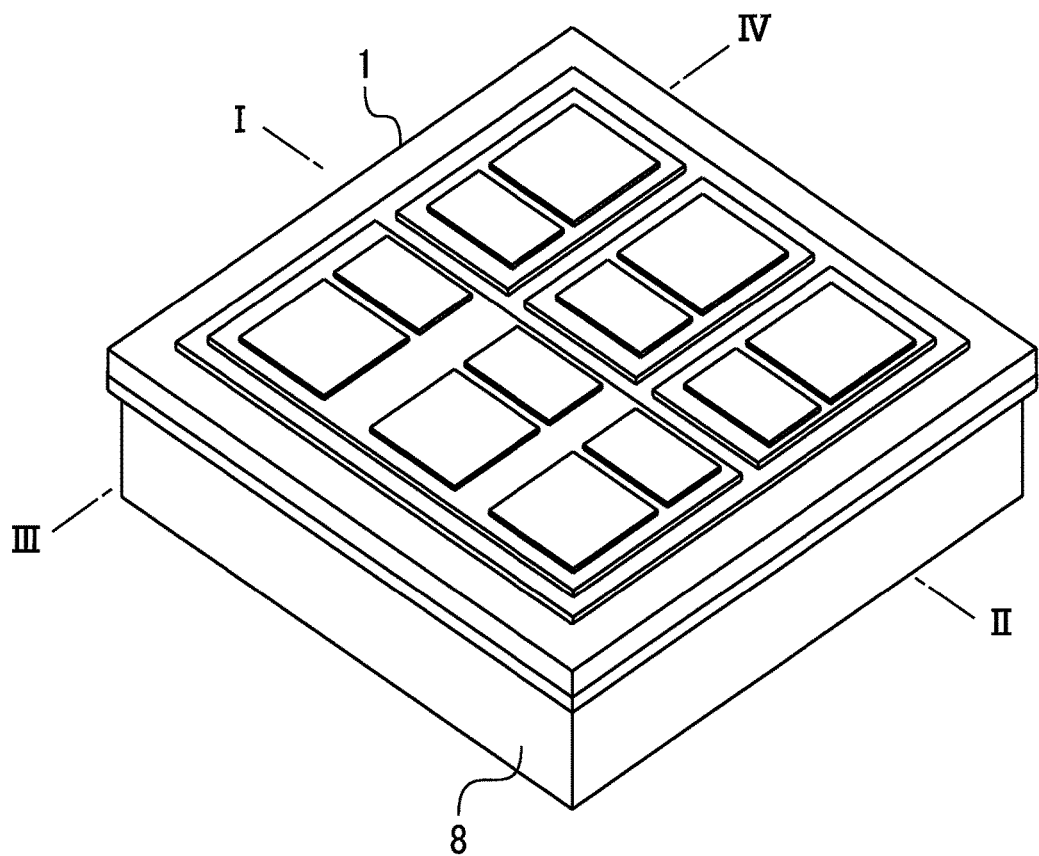
FIG. 19 is a perspective view showing a semiconductor module according to Embodiment 4 of the present invention.
Figure 20:
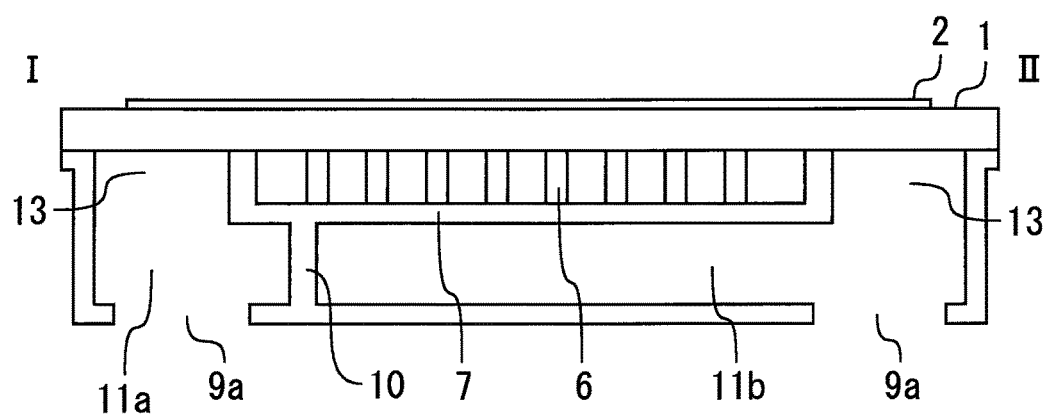
FIG. 20 is a cross-sectional view taken along line I-II of FIG. 19.
Figure 21:
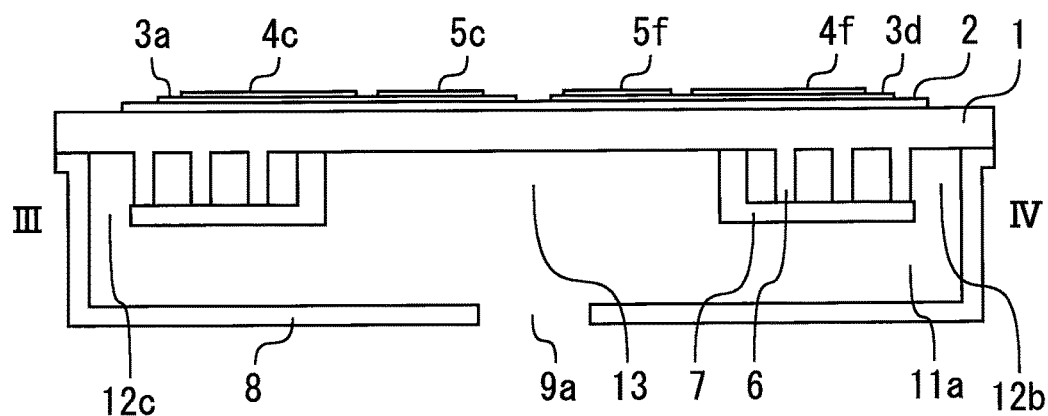
FIG. 21 is a cross-sectional view taken along line III-IV of FIG. 19.

FIG. 19 is a perspective view showing a semiconductor module according to Embodiment 4 of the present invention. FIG. 20 is a cross-sectional view taken along line I-II of FIG. 19. FIG. 21 is a cross-sectional view taken along line III-IV of FIG. 19. Here, a blow-by structure 13, which is free of the plurality of fins 6 and heat dissipating base plate 7, is provided above the inflow port 9a and the outflow port 9b. The spatial volume around the inflow port 9a and the outflow port 9b is increased by the blow-by structure 13 to become a water reservoir portion, so that the pressure loss in the module can be reduced.

In Embodiments 1 to 4, the semiconductor devices 4a to 4f, 5a to 5f are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Embodiment 5

In this embodiment, the semiconductor modules according to Embodiments 1 to 4 described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 22:
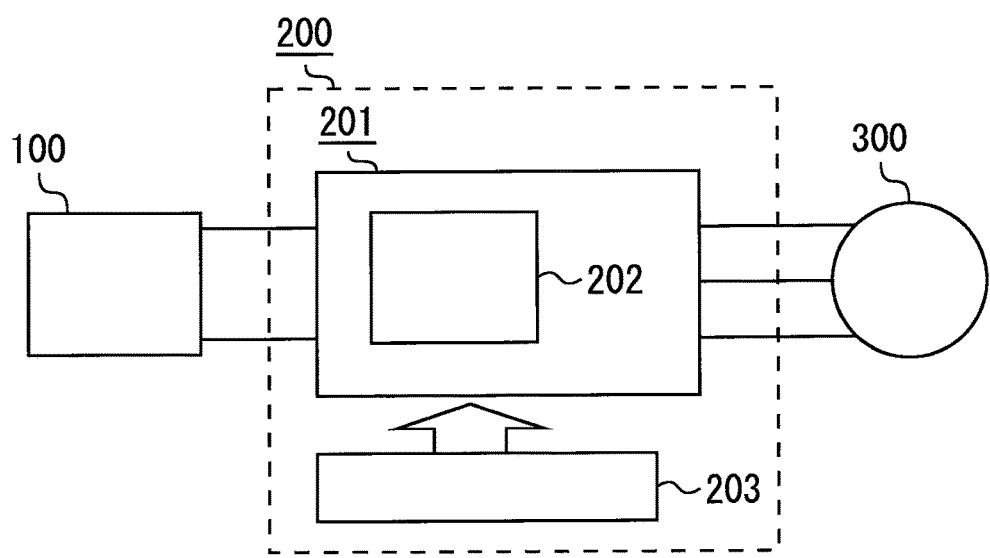
FIG. 22 is a block diagram illustrating a configuration of an electric power conversion system to which the electric power conversion device according to Embodiment 5 is applied.

FIG. 22 is a block diagram illustrating a configuration of an electric power conversion system to which the electric power conversion device according to Embodiment 5 is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of Embodiments 1 to 4 described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor modules according to Embodiments 1 to 4 are applied as the switching devices and the freewheeling diodes of the main conversion circuit 201. Therefore, miniaturization can be realized.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

REFERENCE SIGNS LIST 1 conductive base plate; 2 insulating substrate; 3a to 3d conductive pattern; 4a to 4f, 5a to 5f semiconductor device; 6 fin; 7 heat dissipating base plate; 8 cooler; 9a inflow port; 9b outflow port; 10 partition; 11a inflow-side space; 11b outflow-side space; 12a first slit; 12b second slit; 12c third slit; 13 blow-by structure; 201 main conversion circuit; 203 control circuit

The invention claimed is:
1. A semiconductor module comprising:
a conductive base plate;
an insulating substrate provided on an upper surface of the conductive base plate;
a conductive pattern provided on the insulating substrate;
a plurality of semiconductor devices provided on the conductive pattern;

a plurality of fins provided on a lower surface of the conductive base plate;

a heat dissipating base plate provided to tips of the plurality of fins;

a cooler provided so as to surround the plurality of fins and the heat dissipating base plate and having an inflow port and an outflow port provided in a bottom surface of the cooler; and a partition separating a space surrounded by the cooler and the heat dissipating base plate into an inflow-side space connected to the inflow port and an outflow-side space connected to the outflow port, wherein a first slit is provided in a central portion of the heat dissipating base plate, second and third slits are respectively provided on both sides of the heat dissipating base plate along a direction from an inflow side to an outflow side, and one of the first slit and the second and third slits is an inflow-side slit connected to the inflow-side space and the other is an outflow-side slit connected to the outflow-side space.

2. The semiconductor module according to claim 1, wherein the plurality of semiconductor devices includes a first semiconductor device and a second semiconductor device having a larger calorific value than the first semiconductor device, and the second semiconductor device is arranged closer to the inflow-side slit than the first semiconductor device.

3. The semiconductor module according to claim 2, wherein the second and third slits are the inflow-side slit, and the second semiconductor device is disposed above the second and third slits.

4. The semiconductor module according to claim 2, wherein the first slit is the inflow-side slit, and the second semiconductor device is disposed above the first slit.

5. The semiconductor module according to claim 1, wherein an inflow-side fin of the plurality of fins has a shape which makes it more difficult for cooling water to pass through the inflow-side fin than an outflow-side fin.

6. The semiconductor module according to claim 5, wherein the inflow-side fin has a higher fin density than the outflow-side fin.

7. The semiconductor module according to claim 5, wherein a shape of the plurality of fins is a radial elliptic arc having a center on the inflow side.

8. The semiconductor module according to claim 1, wherein a blow-by structure, which is free of the plurality of fins and the heat dissipating base plate, is provided above the inflow port and the outflow port.

9. The semiconductor module according to claim 1, wherein the plurality of semiconductor devices are made of a wide-band-gap semiconductor.

10. An electric power conversion device comprising:

a main conversion circuit including the semiconductor module according to claim 1, converting input power and outputting converted power; and a control circuit outputting a control signal for controlling the main conversion circuit to the main conversion circuit.

* * * * *